(12) United States Patent
Basker et al.

(10) Patent No.: US 8,860,112 B2
(45) Date of Patent: Oct. 14, 2014

(54) FINFET EDRAM STRAP CONNECTION STRUCTURE

(71) Applicant: International Business Machines Corporation, Armonk, NY (US)

(72) Inventors: Veeraraghavan S. Basker, Schenectady, NY (US); Effendi Leobandung, Wappingers Falls, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/064,381

(22) Filed: Oct. 28, 2013

(65) Prior Publication Data

US 2014/0151773 A1 Jun. 5, 2014

Related U.S. Application Data

(63) Continuation of application No. 14/011,830, filed on Aug. 28, 2013, now abandoned, which is a continuation of application No. 13/705,477, filed on Dec. 5, 2012, now Pat. No. 8,673,729.

(51) Int. Cl.
*H01L 27/108* (2006.01)
*H01L 23/00* (2006.01)

(52) U.S. Cl.
CPC ............ *H01L 24/40* (2013.01); *H01L 27/1082* (2013.01); *H01L 27/10826* (2013.01)
USPC .............. 257/300; 257/E27.084; 257/E27.095

(58) Field of Classification Search
USPC ................... 257/E21.176, E21.646, E27.084, 257/E27.095, 300
See application file for complete search history.

(56) References Cited

U.S. PATENT DOCUMENTS

| | | | |
|---|---|---|---|
| 6,624,031 B2 | 9/2003 | Abadeer et al. | |
| 7,985,633 B2 | 7/2011 | Cai et al. | |
| 2004/0150037 A1* | 8/2004 | Katsumata et al. | 257/330 |
| 2008/0048186 A1 | 2/2008 | Cheng et al. | |
| 2009/0086523 A1 | 4/2009 | Hartwich et al. | |
| 2009/0096003 A1 | 4/2009 | Zhu | |
| 2009/0184357 A1 | 7/2009 | Wu | |
| 2011/0079836 A1 | 4/2011 | Lin | |
| 2011/0248326 A1* | 10/2011 | Kanakasabapathy et al. | 257/300 |
| 2013/0092992 A1 | 4/2013 | Chang et al. | |

OTHER PUBLICATIONS

Katsumata, R. et al.; "Fin-Array-FET on bulk silicon for sub-100nm Trench Capacitor DRAM"; 2003 Symposium on VLSI Technology; Digest of Technical Papers; Jun. 2003; pp. 61-62.

* cited by examiner

*Primary Examiner* — Zandra Smith
*Assistant Examiner* — Paul Patton
(74) *Attorney, Agent, or Firm* — Harrington & Smith

(57) ABSTRACT

A method of forming a strap connection structure for connecting an embedded dynamic random access memory (eDRAM) to a transistor comprises forming a buried oxide layer in a substrate, the buried oxide layer defining an SOI layer on a surface of the substrate; forming a deep trench through the SOI layer and the buried oxide layer in the substrate; forming a storage capacitor in a lower portion of the deep trench; conformally doping a sidewall of an upper portion of the deep trench; depositing a metal strap on the conformally doped sidewall and on the storage capacitor; forming at least one fin in the SOI layer, the fin being in communication with the metal strap; forming a spacer over the metal strap and over a juncture of the fin and the metal strap; and depositing a passive word line on the spacer.

12 Claims, 6 Drawing Sheets

US 8,860,112 B2

FINFET EDRAM STRAP CONNECTION STRUCTURE

CROSS REFERENCE

This application is a continuation of U.S. patent application Ser. No. 14/011,830, filed on Aug. 28, 2013, which is a continuation of U.S. patent application Ser. No. 13/705,477, filed on Dec. 5, 2012, the contents of both applications being incorporated herein by reference in their entireties.

BACKGROUND

The exemplary embodiments of this invention relate generally to memory in semiconductor devices and, more particularly, to a strap connection structure for connecting an embedded dynamic random access memory (eDRAM) to a transistor.

A complementary metal oxide semiconductor device (CMOS) uses symmetrically-oriented pairs of p-type and n-type metal oxide semiconductor field effect transistors (MOSFETs) arranged on silicon or silicon-on-insulator (SOI) substrates. Source and drain regions associated with the MOSFET are connected by a channel. A gate disposed over the channel controls the flow of current between the source and drain regions. The channel may be defined by a thin "fin" that provides more than one surface through which the gate controls the flow of current, thereby making the MOSFET a "finFET" device.

Dynamic random access memory (DRAM) employs memory cells having a finFET (or other type of transistor) and a storage capacitor arranged in series. Embedded DRAM (eDRAM) embeds these memory cells into the same semiconducting material that contains a microprocessor, which allows for wider buses and faster operating speeds (as compared to DRAM) in an integrated circuit (IC) chip. Many of these embedded memory cells comprising finFETs and storage capacitors can be arranged on a single chip or within a single package to define an array. Operation of the memory cells is controlled by various circuits, many of which are structurally different from each other, and warrant different manufacturing techniques.

BRIEF SUMMARY

In one exemplary aspect, a method of fabricating a strap connection structure for connecting an embedded dynamic random access memory (eDRAM) to a transistor comprises forming a buried oxide layer in a substrate, the buried oxide layer defining an SOI layer on a surface of the substrate; forming a deep trench through the SOT layer and the buried oxide layer in the substrate; forming a storage capacitor in a lower portion of the deep trench; conformally doping a sidewall of an upper portion of the deep trench; depositing a metal strap on the conformally doped sidewall and on the storage capacitor; depositing an oxide layer on the metal strap; forming at least one fin of a transistor in the SOI layer, the fin being in communication with the metal strap; forming a spacer over the oxide layer and over a juncture of the fin and the metal strap; and depositing a passive word line on the spacer.

In another exemplary aspect, a semiconductor structure comprises a substrate comprising a buried oxide layer; a storage capacitor in a lower portion of a deep trench formed in at least the buried oxide layer of the substrate; a metal strap on an upper portion of a sidewall of the deep trench and on the storage capacitor; a fin of a transistor disposed on the substrate and in communication with the metal strap; a spacer formed over a juncture of the fin and the metal strap; and a PWL deposited over the spacer.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

In exemplary embodiments of the present invention, an eDRAM strap connection structure for a finFET provides communication between a storage capacitor and a first end of a fin of the finFET. The storage capacitor is located in a deep trench formed in a substrate, and the fin is formed on a surface of the substrate. As is known by those of skill in the art, a deep trench is one in which the depth from an upper edge of the trench to a bottom of the trench is about 5 micrometers (um) or greater.

The eDRAM strap connection structure comprises a metal strap that allows for connection of the fin to the storage capacitor in the deep trench. An oxide layer may be disposed on a top of the deep trench adjacent to the metal strap. The metal strap is in direct physical communication with a sidewall of the fin. The metal strap is sealed over the deep trench via a nitride spacer to prevent errant electrical communication (shorting) between a passive wordline (PWL) and the deep trench and to inhibit parasitic current flow to the deep trench.

Figure 1A:
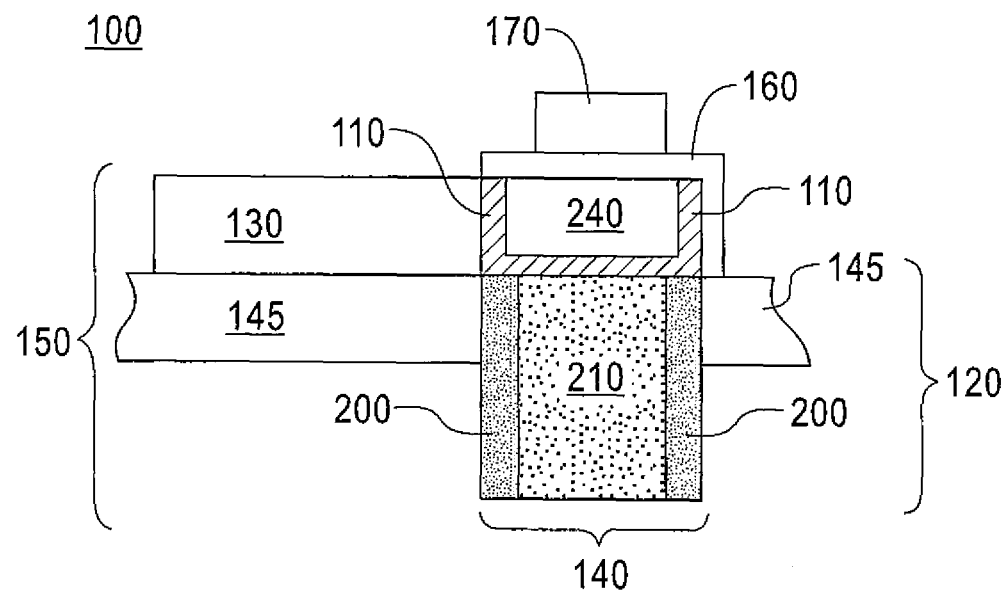
FIG. 1A is a side cross-sectional view of an eDRAM strap connection structure for a finFET.
Figure 1B:
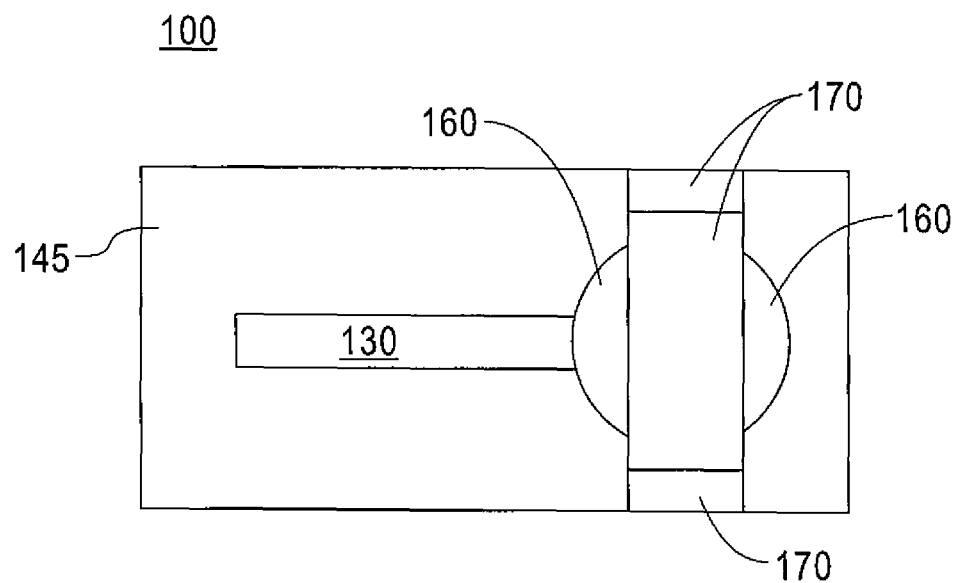
FIG. 1B is a top view of the structure of FIG. 1A.

As shown in FIGS. 1A and 1B, one exemplary embodiment of an eDRAM strap connection structure for a finFET is designated generally by the reference number 100 and is hereinafter referred to as "structure 100." Structure 100 comprises a metal strap 110 (shown in FIG. 1A) that provides communication between a storage capacitor 120 and a fin 130 of a finFET. The storage capacitor 120 is disposed in a deep trench 140 formed in a buried oxide layer 145 as well as in any underlying bulk substrate material of a substrate 150, and the fin 130 is formed from an SOI material at an upper surface of the substrate 150. Communication between the storage capacitor 120 and the fin 130 is effected through the metal strap 110. A spacer 160 is formed over the metal strap 110 and a portion of the fin 130, and a passive wordline 170 (PWL 170) is located on the spacer 160.

Figure 2:
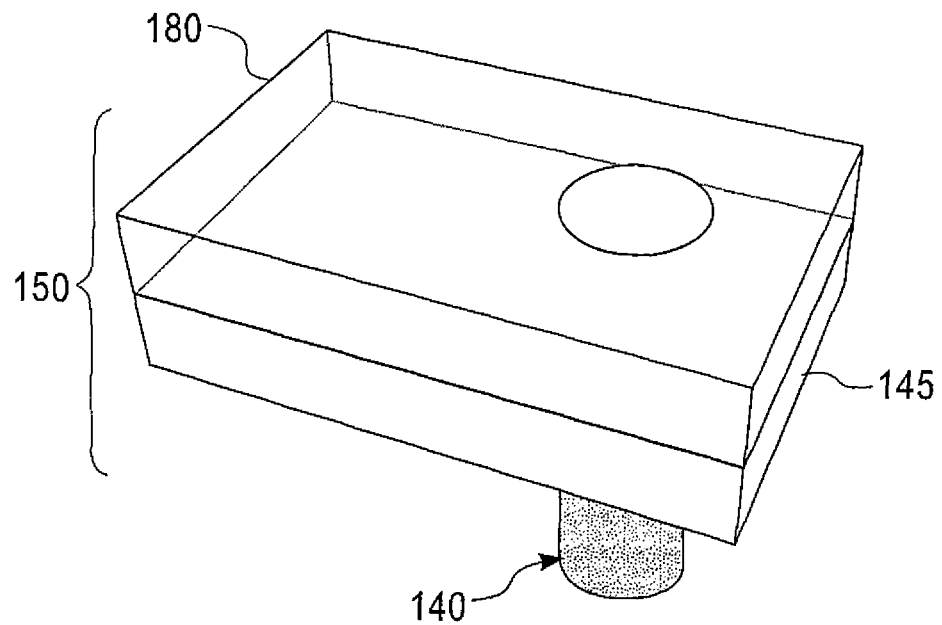
FIG. 2 is a perspective view of a substrate used in the fabrication of the structure of FIGS. 1A and 1B.

As shown in FIGS. 2-9, one exemplary method of fabricating the structure 100 is shown. Referring now to FIG. 2, the substrate 150 is provided as the bulk substrate material into which oxygen ions are implanted to form the buried oxide layer 145 of silicon dioxide ($SiO_2$) that defines an SOI layer 180 at the surface of the substrate 150. The deep trench 140 is formed in the substrate 150 using any suitable method, such as etching.

Figure 3:
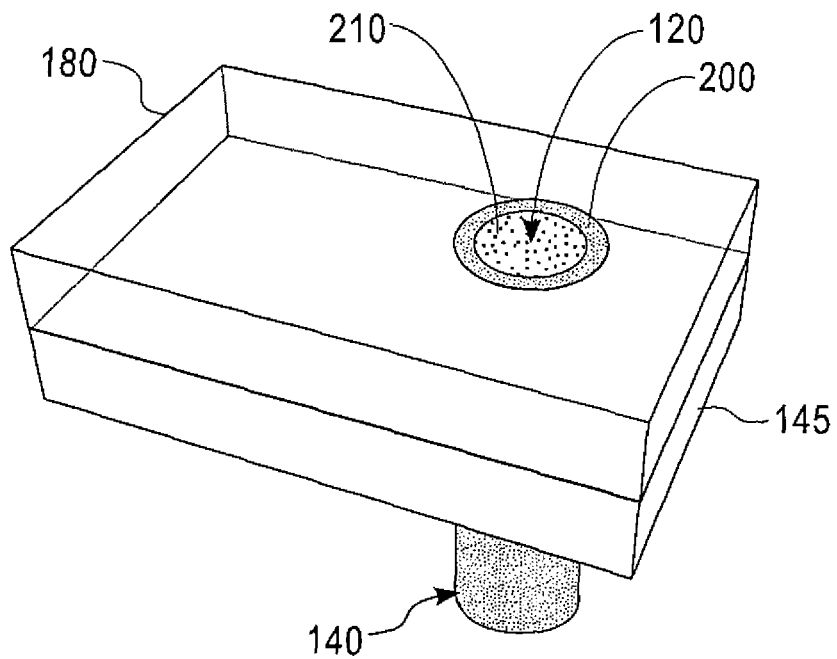
FIG. 3 is a perspective view of one exemplary step in the forming of a storage capacitor in the substrate of FIG. 2.
Figure 4:
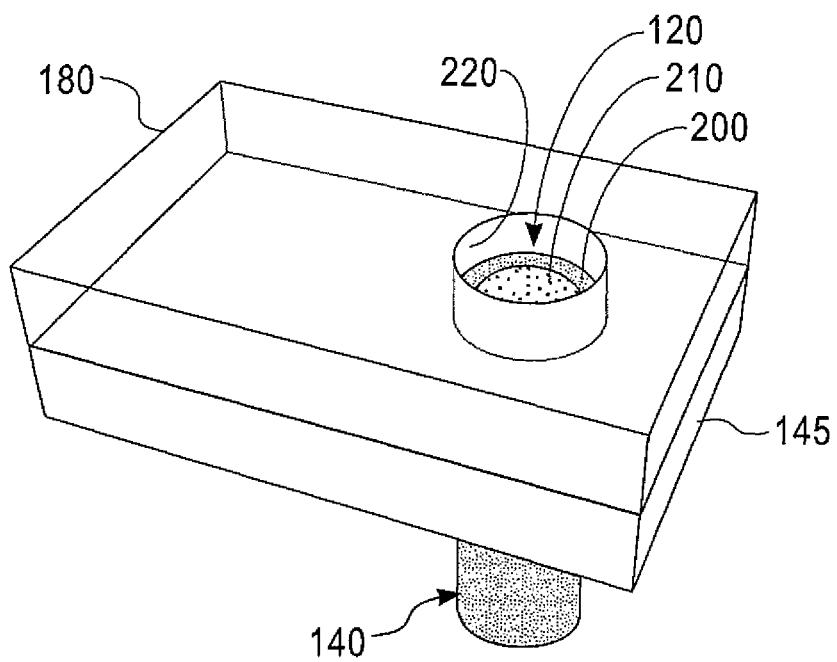
FIG. 4 is a perspective view of another exemplary step in the forming of a storage capacitor in the substrate of FIG. 3.

As shown in FIGS. 3 and 4, the storage capacitor 120 is formed in the deep trench 140. In forming the storage capacitor 120, a film of high k dielectric material (hereinafter referred to as "dielectric film 200") is first deposited on at least the sidewalls of the opening forming the deep trench 140, as shown in FIG. 3. High k dielectric materials that may be deposited on the sidewalls include, but are not limited to, hafnium silicate, zirconium silicate, hafnium dioxide, zirconium dioxide, combinations of the foregoing, and the like. Deposition of the dielectric film 200 may be by chemical vapor deposition (CVD) or atomic layer deposition.

After deposition of the dielectric film 200, the deep trench 140 is filled with a conductor 210 to define the storage capacitor 120. In doing so, the conductor 210 is filled up to the edge of the surface of the SOI layer 180. The conductor 210 may be a poly conductor (e.g., polysilicon) or a metal.

As shown in FIG. 4, the dielectric film 200 and the conductor 210 are recessed from an upper surface of the SOI layer 180 using an etching technique such that the storage capacitor 120 is defined in a lower portion of the deep trench 140. Any suitable anisotropic etching technique (e.g., dry etching) may be employed. Recessing the dielectric film 200 and the conductor 210 allows the silicon of the SOI layer 180 to be exposed in a sidewall 220 in an upper portion of the deep trench 140, the exposed sidewall 220 being configured to receive the metal strap 110.

Figure 5:
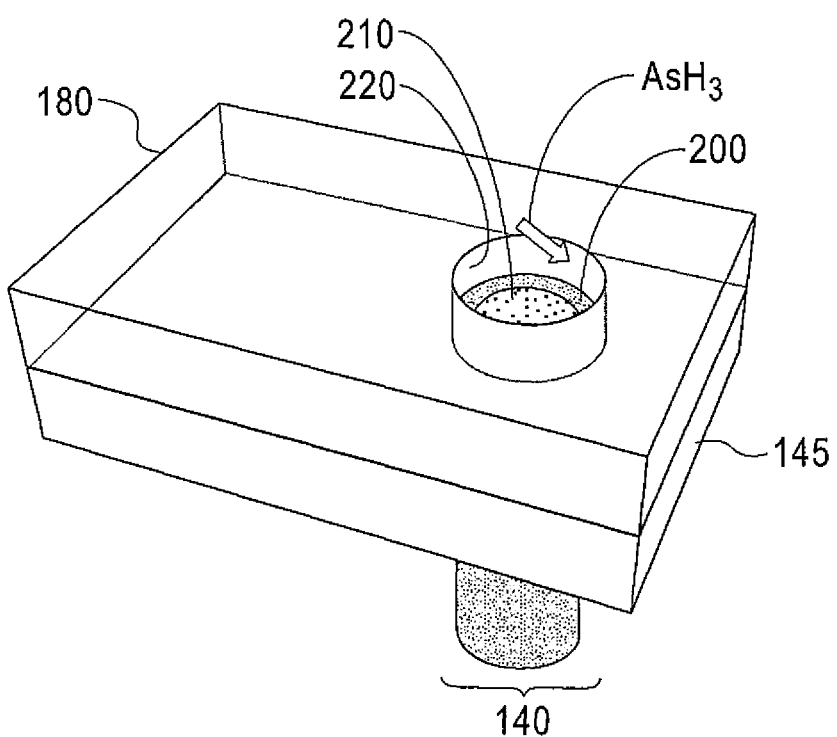
FIG. 5 is a perspective view of one exemplary step in the forming of a metal strap for the structure of FIGS. 1A and 1B.

As shown in FIG. 5, the silicon of the SOI layer 180 where the dielectric film 200 and the conductor 210 are etched back (i.e. the sidewall 220 in the upper portion of the deep trench 140) is conformally doped. Conformal doping of the silicon of the SOI layer 180 facilitates electrical communication between the metal strap 110 and the fin 130. In one embodiment, the conformal doping is with arsine (arsenic trihydride ($AsH_3$)) to form an arsine layer, which is deposited by a CVD technique to a depth of about 10 Angstroms to about 20 Angstroms and subsequently driven into the silicon of the sidewall 220 by subjecting the deposited arsine to a temperature of about 1,000 degrees C. to about 1,100 degrees C. Excess arsine film is then stripped away using a wet etch (using either hydrofluoric or sulfuric acid).

Figure 6:
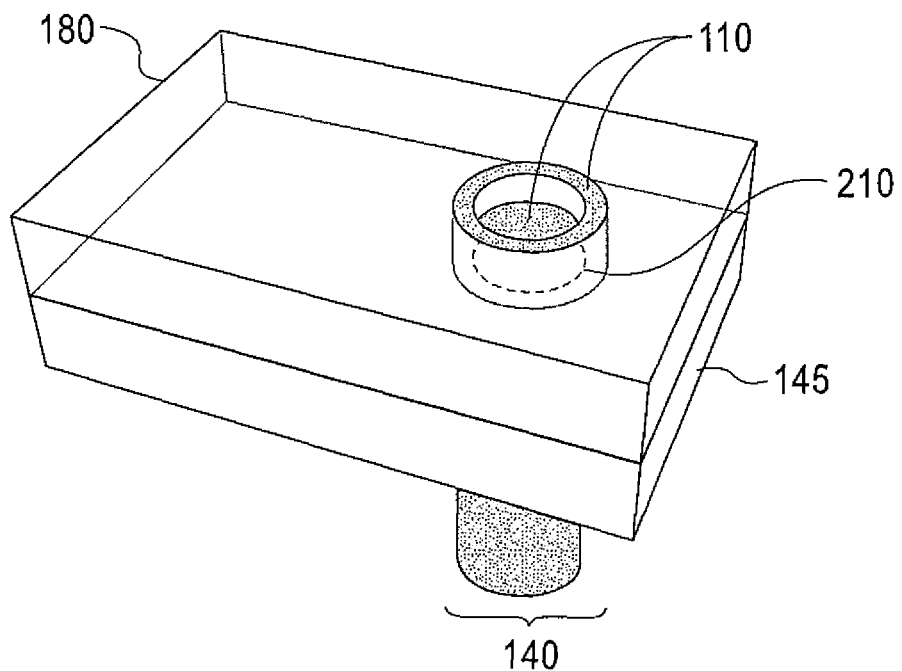
FIG. 6 is a perspective view of another exemplary step in the forming of a metal strap for the structure of FIG. 5.

As shown in FIG. 6, the metal strap 110 is deposited on the conformally doped silicon of the SOI layer 180 of the exposed sidewall 220 of the deep trench 140 as a film by using a metal vapor deposition technique. The metal strap 110 is a cup-like member that substantially covers the conformally doped silicon of the sidewall 220 of the deep trench 140 and upper surfaces of the dielectric film 200 and the conductor 210. The deposition of the metal strap 110 connects the source areas or drain areas of the fin 130 to the storage capacitor 120 and allows for the formation of a metal-semiconductor junction between a metal and the silicon, thereby creating a Schottky barrier. Metals that may be deposited to form the metal strap 110 include, but are not limited to, titanium nitrides (TiN), tantalum nitrides (TaN), and tantalum aluminum nitrides (TaAlN).

Figure 7:
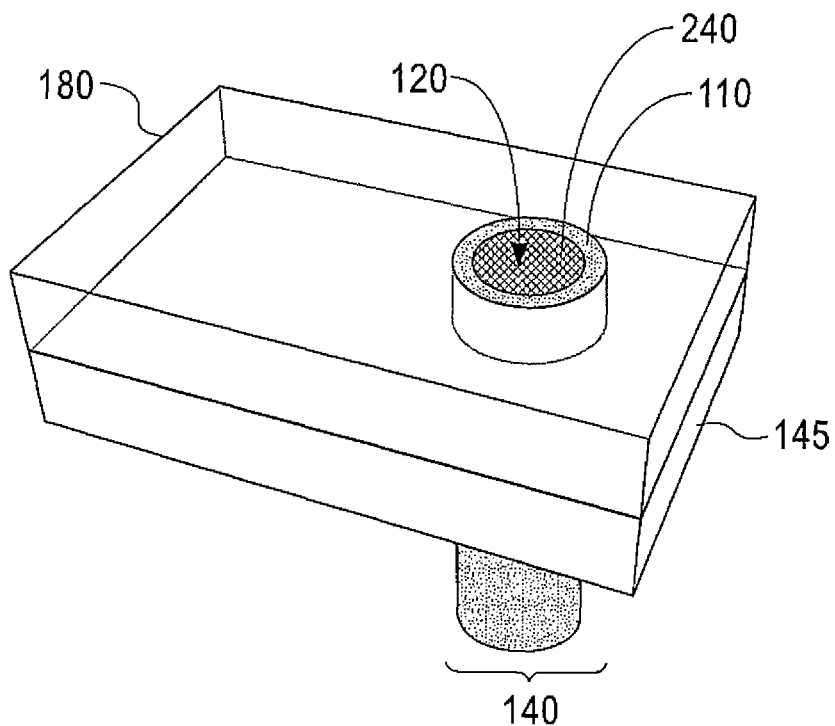
FIG. 7 is a perspective view of another exemplary step in the fabrication of the structure.

As shown in FIG. 7, a trench top oxide (TTO) layer 240 may optionally be deposited in an upper portion of the deep trench 140 and on the metal strap 110 to fill the top of the deep trench 140. In exemplary embodiments incorporating the TTO layer 240, the TTO layer 240 comprises an oxide (such as $SiO_2$ or the like) that, when disposed in the top of the deep trench 140, isolates the PWL 170 from metal strap 110 and the conductor 210 of the storage capacitor 120. In exemplary embodiments not incorporating the TTO layer 240, the upper portion of the deep trench 140 (on the metal strap 110) may be completely filled with metal.

Figure 8:
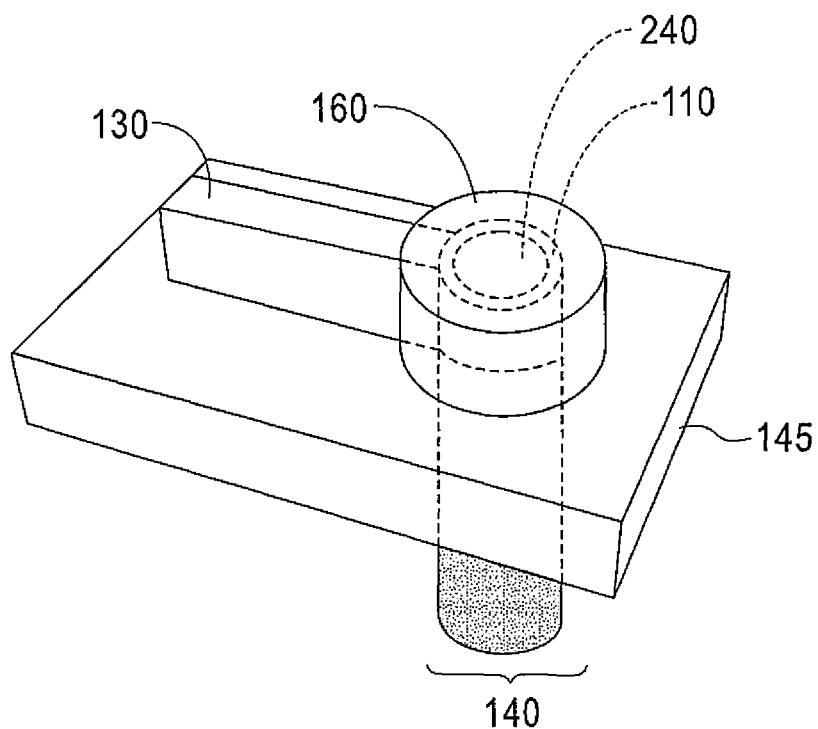
FIG. 8 is a perspective view of an exemplary step in the forming of a fin for connection to the structure and the forming of a spacer between the fin and the storage capacitor.

Referring now to FIG. 8, the SOT layer 180 is patterned and etched to form at least one fin 130, (only one of which is shown), and the spacer 160 is formed at an end of the formed fin 130 and over the TTO layer 240. After forming, the fin 130 is in direct physical contact with the metal strap 110. The SOI layer 180 is etched to form the fin 130 using any suitable etching technique, for example, a plasma dry etching technique such as reactive ion etching (RIE).

The spacer 160 is formed at the end of the formed fin 130 by depositing a hardmask material over substantially the entire exposed surface of the substrate 150. More specifically, the material of the spacer 160 is formed over a juncture of the fin 130 and the metal strap 110 by depositing the hardmask material over at least the TTO layer 240 (if present), the metal strap 110, and an end portion of the fin 130. A trench top oxide mask is then used to pattern the deposited hardmask material in the configuration of the spacer 160 at the juncture of the fin 130 and the metal strap 110. The hardmask material is then removed according to the patterning, thereby opening a region in the area of the fin 130 and leaving the spacer 160. Exemplary hardmask materials from which the spacer may be formed are SiN and $Si_3N_4$. However, any dielectric material such as $SiO_2$, silicon carbon nitride, or the like may be used to form the spacer 160.

Figure 9:
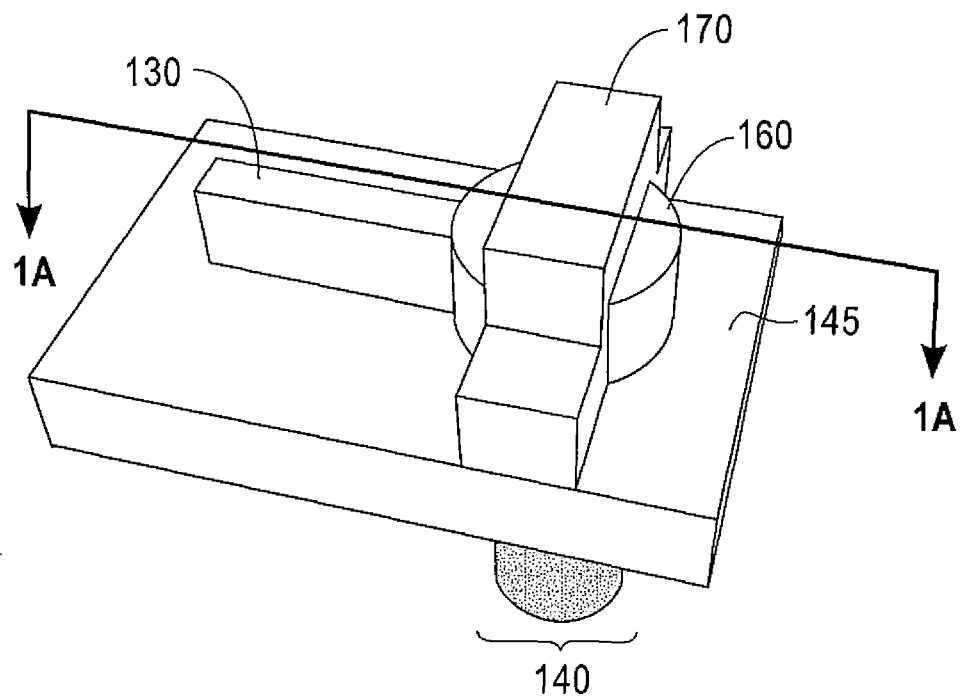
FIG. 9 is a perspective view of the structure of FIGS. 1A and 1B.

As shown in FIG. 9, depositing the hardmask material to form the spacer 160 seals the metal strap 110 to the fin 130. The PWL 170, which is a conductive material such as tungsten or copper, is deposited over the spacer 160 using a metal vapor deposition technique. The spacer 160 prevents or at least inhibits shorting between the PWL 170 and the storage capacitor 120. The spacer also reduces the amount of parasitic coupling between the PWL 170 and the storage capacitor 120.

Figure 10:
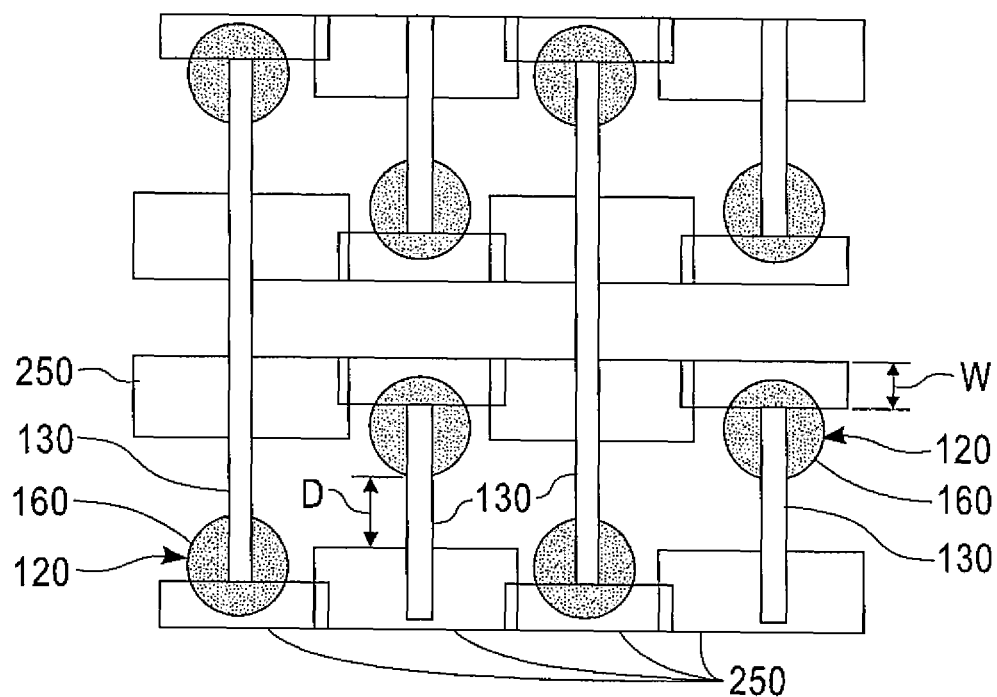
FIG. 10 is a schematic representation of a plurality of eDRAM strap connection structures providing communication between storage capacitors and fins.

As shown in FIG. 10, after deposition and removal of the hardmask material to form the spacer 160, an epitaxial process for doping source regions and drain regions is carried out on a wafer on which the storage capacitors 120 and fins 130 connected by eDRAM strap connection structures 100 are arranged. The storage capacitors 120 and fins 130 are arranged to provide for suitable distance between the storage capacitors 120 and gates 250 to allow for the growth of an epitaxial layer. In one exemplary embodiment, a distance D between a capacitor 120 and a gate 250 is about 46 nanometers (nm), and a width W of a gate 250 in communication with a capacitor 120 is about 40 nm. A width of a spacer 160 on the capacitor is about 10 nm. An overlay tolerance between the gate 250 and the deep trench under the spacer 160 and in which the capacitor 120 is positioned is about 8 nm, and a variation in the critical dimension of the gate 250 is about 2 nm (which is about 5%). Based on these dimensions, there is about a 26 nm minimum distance between the source regions and drain regions under any fin 130, thereby leaving suitable distance on the wafer for growth of an epitaxial layer and junction overlaps between the gates 250. Without junction overlaps, gaps would be formed in parts of fins 130 controlled by the gates 250, thereby resulting in increased resistances, which would lead to penalties in performance of devices on the wafer.

The terminology used herein is for the purpose of describing particular exemplary embodiments only and is not intended to be limiting of the exemplary embodiments of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Any use of the terms "connected," "coupled," or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical, or any suitable combination thereof in accordance with the described exemplary embodiments. As non-limiting examples, the connection or coupling may comprise one or more printed electrical connections, wires, cables, mediums, or any suitable combination thereof.

Generally, various exemplary embodiments of the invention can be implemented in different mediums, such as software, hardware, logic, special purpose circuits, or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the exemplary embodiments of this invention could be used to advantage without the corresponding use of other features. As such, the foregoing description should be considered as merely illustrative of the principles of the invention, and not in limitation thereof.

The invention claimed is:

1. A semiconductor structure, comprising:
a substrate comprising a buried oxide layer;
a storage capacitor in a lower portion of a deep trench formed in at least the buried oxide layer of the substrate;
a metal strap on a conformally doped surface of an upper portion of a sidewall of the deep trench and on the storage capacitor;
a fin of a transistor disposed on the substrate and in communication with the metal strap;
a spacer formed over a juncture of the fin and the metal strap; and
a PWL deposited over the spacer.

2. The semiconductor structure of claim 1, further comprising an oxide layer disposed in the upper portion of the sidewall of the deep trench and on the metal strap.

3. The semiconductor structure of claim 1, wherein the storage capacitor comprises a high k dielectric material disposed on a sidewall of the lower portion of the deep trench and on the storage capacitor and a conductor disposed on the high k dielectric material.

4. The semiconductor structure of claim 3, wherein the high k dielectric material is selected from the group consisting of hafnium dioxide, hafnium silicate, zirconium dioxide, zirconium silicate, and combinations of the foregoing.

5. The semiconductor structure of claim 3, wherein the conductor is one of a poly conductor and a metal.

6. The semiconductor structure of claim 1, wherein the conformally doped surface comprises arsine.

7. The semiconductor structure of claim 1, wherein the metal strap connects the source areas or drain areas of the fin to the storage capacitor to form a Schottky barrier.

8. The semiconductor structure of claim 7, wherein the metal strap comprises a material selected from the group of materials consisting of titanium nitrides, tantalum nitrides, and tantalum aluminum nitrides.

9. The semiconductor structure of claim 1, wherein the buried oxide layer comprises $SiO_2$.

10. The semiconductor structure of claim 1, wherein the spacer comprises one or more of SiN, $Si_3N_4$, $SiO_2$, and silicon carbon nitride.

11. The semiconductor structure of claim 1, wherein the PWL is a conductive material.

12. The semiconductor structure of claim 11, wherein the PWL is tungsten.

* * * * *